US010020235B2

(12) United States Patent
Voss et al.

(10) Patent No.: US 10,020,235 B2
(45) Date of Patent: Jul. 10, 2018

(54) SELECTIVE SURFACE TREATMENT OF THALLIUM BROMIDE (TLBR)-BASED DETECTORS TO IMPROVE LONGEVITY AND/OR RESTORE OPERATIONAL CAPACITY THEREOF

(71) Applicant: Lawrence Livermore National Security, LLC, Livermore, CA (US)

(72) Inventors: Lars Voss, Livermore, CA (US); Adam Conway, Livermore, CA (US); Robert T. Graff, Modesto, CA (US); Art Nelson, Livermore, CA (US); Rebecca J. Nikolic, Oakland, CA (US); Stephen A. Payne, Castro Valley, CA (US); Erik Lars Swanberg, Jr., Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 15/340,849

(22) Filed: Nov. 1, 2016

(65) Prior Publication Data
US 2018/0122713 A1 May 3, 2018

(51) Int. Cl.
*H01L 31/115* (2006.01)
*H01L 21/66* (2006.01)
(Continued)

(52) U.S. Cl.
CPC ............ *H01L 22/20* (2013.01); *H01L 31/032* (2013.01); *H01L 31/035272* (2013.01);
(Continued)

(58) Field of Classification Search
CPC ............... H01L 22/20; H01L 31/032; H01L 31/035272; H01L 31/085; H01L 31/18; G01T 1/24
(Continued)

(56) References Cited

U.S. PATENT DOCUMENTS 4,678,275 A * 7/1987 Ikedo ................ C03B 37/023
385/142
9,000,384 B2 4/2015 Conway et al.
(Continued)

*Primary Examiner* — Tu-Tu Ho
(74) *Attorney, Agent, or Firm* — Zilka-Kotab, PC

(57) ABSTRACT

In various approaches room-temperature gamma detector longevity may be improved by selectively removing, or selectively incorporating, alternate halogen component(s) from select surfaces of the detector. According to one embodiment, a method of improving operational longevity of a thallium bromide (TlBr)-based detector includes: selectively treating one or more surfaces of the TlBr-based detector to produce a surface substantially comprising pure TlBr. Similar techniques may be employed to restore a degraded or failed detector. According to another embodiment, a method of forming a TlBr-based detector exhibiting improved operational longevity includes: selectively treating one or more surfaces of the TlBr-based detector to replace Br therein with one or more alternate halogen components while also substantially avoiding replacing some or all of the Br in other surfaces of the TlBr-based detector with the one or more alternate halogen components. Corresponding structures for TlBr-based detectors with improved longevity are also described.

21 Claims, 5 Drawing Sheets

(51) Int. Cl.
  *H01L 31/032* (2006.01)
  *H01L 31/18* (2006.01)
  *H01L 31/0352* (2006.01)
  *H01L 31/08* (2006.01)
  *G01T 1/24* (2006.01)

(52) U.S. Cl.
  CPC ............ *H01L 31/085* (2013.01); *H01L 31/18* (2013.01); *G01T 1/24* (2013.01)

(58) Field of Classification Search
  USPC ........................................................ 257/429
  See application file for complete search history.

(56) References Cited

U.S. PATENT DOCUMENTS

| | | | | |
|---|---|---|---|---|
| 2012/0107503 A1* | 5/2012 | Abelson | .............. | C23C 16/0272 427/255.7 |
| 2013/0026364 A1* | 1/2013 | Conway | ................... | B32B 9/00 250/336.1 |
| 2014/0355745 A1* | 12/2014 | Kominami | ................ | G01T 1/24 378/189 |

* cited by examiner

SELECTIVE SURFACE TREATMENT OF THALLIUM BROMIDE (TLBR)-BASED DETECTORS TO IMPROVE LONGEVITY AND/OR RESTORE OPERATIONAL CAPACITY THEREOF

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to TlBr-based detectors, and more particularly, this invention relates to fabrication techniques and corresponding structures for improving longevity of TlBr-based detectors via selective treatment of one or more surfaces of the detector.

BACKGROUND

Room temperature spectroscopy is a long-sought application for radiation detection, which historically has required operation of detectors at cryogenic temperatures (e.g. less than 77 Kelvin) for semiconductor devices. The development of detectors capable of reliably and sensitively detecting radiation of a particular type has required development of new materials to avoid the undesirable power and practical constraints imposed by cryogenic operation. One detector employed today for room temperature spectrometry is a thallium bromide-based material (TlBr).

However, TlBr-based compounds suitable for use as radiation detectors, particularly gamma detectors, are subject to rapid degradation and damage. The TlBr detectors are typically soft, and thus subject to mechanical damage, as well as sensitive to oxidation and other chemical reactions with the surrounding environment. Notably, biased TlBr detectors degrade in the presence of air, and even more rapidly in an environment of nitrogen gas, ultimately resulting in formation of thallium metal pathways on the detector surface. As TlBr is a semiconductor, but Tl is a conductor, the conductive pathways formed from Tl are more conductive than the TlBr bulk, and tend to short out the detector. Such shorts render the detector useless in its intended application.

Application of a bias to TlBr-based detectors, as is performed during detection of target radiation, accelerates the degradation of the detector. This phenomenon is expected due to the nature of TlBr as an ionic conductor.

Accordingly, to improve the longevity of TlBr-based detector compositions, conventional techniques involve the use of Tl metal-based electrodes on the detector, optionally coupled with switching the voltage polarity after some small period of time, typically 24 hrs. Additionally or alternatively, replacing some or all of the Br at the surface of the detector with an alternate halogen, e.g. F, Cl, or I, has been employed to facilitate greater longevity of TlBr-based detectors.

However, using Tl-based electrodes and switching the voltage polarity only modestly extends the longevity of the detector, while the inventors of the presently disclosed inventive concepts discovered that surfaces incorporating a halogen other than or in addition to Br degrade more rapidly than the TlBr-based bulk material when exposed to air or nitrogen. Since room temperature (e.g. 22-27° C.) is the temperature of operation for most applications to which TlBr-based detectors are particularly suited, and this ability to operate at room temperature is the primary advantage of TlBr-based detectors, degradation of the type observed and shown in FIG. 1 is catastrophic.

Accordingly, it would be advantageous to provide techniques for forming TlBr-based detector structures that improve the longevity of the detector without introducing a tendency to form conductive pathways through the detector or on the detector surface in the presence of common atmospheric components such as nitrogen, oxygen, carbon dioxide, etc.

SUMMARY

According to one embodiment, a method of improving operational longevity of a thallium bromide (TlBr)-based detector via selective removal of alternate halogen components from surfaces thereof includes: selectively treating one or more surfaces of the TlBr-based detector to produce a surface substantially comprising pure TlBr. Prior to selective treatment the one or more surfaces of the TlBr-based detector are compositionally characterized by some or all of the Br having been replaced with one or more alternate halogen components.

According to another embodiment, a method of forming a thallium bromide (TlBr)-based detector exhibiting improved operational longevity via selective inclusion of alternate halogen components in surfaces thereof includes: selectively treating one or more surfaces of the TlBr-based detector to replace Br therein with one or more alternate halogen components while also substantially avoiding replacing some or all of the Br in other surfaces of the TlBr-based detector with the one or more alternate halogen components.

According to yet another embodiment a method of selectively treating one or more surfaces of a thallium bromide (TlBr)-based detector to improve operational longevity thereof or restore operational capability as a room temperature detector thereto includes: detecting either a failure of the TlBr-based detector or degradation of one or more surfaces of the TlBr-based detector, the failure or degradation comprising formation of a complete or partial conductive pathway between electrodes coupled to the TlBr-based detector; and selectively treating at least portions of the one or more surfaces of the TlBr-based detector exhibiting either the failure or the degradation.

In still more embodiments, a thallium bromide (TlBr)-based detector, includes: a bulk portion comprising TlBr, the bulk portion having one or more sidewalls, a top surface, and a bottom surface. At least the sidewalls of the bulk portion include substantially no alternate halogen component(s) to a predetermined depth.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION

Figure 1A:
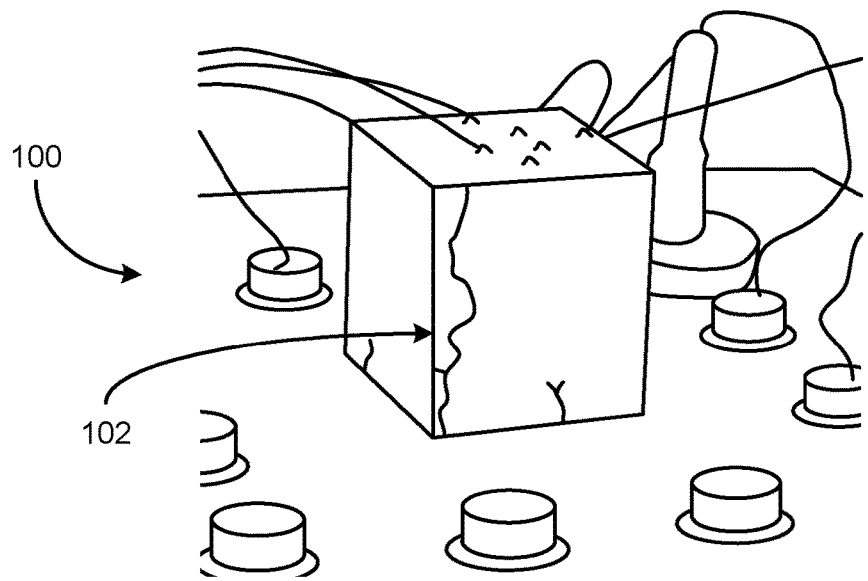
FIG. 1A is an image of a conventional TlBr-based detector with surfaces where some or all of the Br has been replaced with an alternate halogen (e.g. F, Cl, and/or I), and dendritic Tl pathways formed thereon during operation of the detector in an atmosphere of air.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of thallium bromide (TlBr)-based detectors, and more particularly, this invention relates to fabrication techniques and corresponding structures for improving longevity of TlBr detectors via treatment of one or more surfaces of the detector.

TlBr is a semiconductor of interest for use in room temperature gamma spectrometers. Currently, use of TlBr is primarily limited by degradation under applied bias, related to its nature as an ionic conductor. Methods of improving the longevity of TlBr include the use of Tl contacts, treatment of the TlBr surface with another halogen such as Cl or F to create a heterojunction, operation below room temperature, and operation in air. The presently disclosed inventive concepts improve upon previous work using halogens. A TlBr-based detector is produced, having surfaces beneath the electrical contacts chemically treated so that some or all of the Br at the surface of the detector has been replaced with an alternate halogen, e.g. F, Cl, or I while those exposed to the environment, e.g. surfaces not under the contacts, are left or returned to pristine TlBr via etching or polishing. Further, a degraded detector can be returned to operational status by treating the sides of said detector to return it to pristine condition, for example by chemical etching or polishing.

As referenced herein, the terms "operative longevity," "operational longevity," "longevity" and the like are to be understood as meaning the structure exhibiting such longevity is resistant to degradation experienced in the normal course of operation. Such degradation shall be understood to include, but not be limited to, formation of conductive pathways between electrodes formed on or coupled to different surfaces of a detector.

"Improved" longevity shall be understood as indicative of an increase in the detector's ability to operate under identical conditions relative to operation of a conventional TlBr-based detector that is not formed, restored, and/or selectively treated according to the presently disclosed inventive concepts. In preferred embodiments, detectors formed, restored, and/or selectively treated as described herein exhibit approximately two orders of magnitude increased longevity relative to conventional TlBr-based detectors.

According to one general embodiment, a method of improving operational longevity of a thallium bromide (TlBr)-based detector via selective removal of alternate halogen components from surfaces thereof includes: selectively treating one or more surfaces of the TlBr-based detector to produce a surface substantially comprising pure TlBr. Prior to selective treatment the one or more surfaces of the TlBr-based detector are compositionally characterized by some or all of the Br having been replaced with one or more alternate halogen components.

According to another general embodiment, a method of forming a thallium bromide (TlBr)-based detector exhibiting improved operational longevity via selective inclusion of alternate halogen components in surfaces thereof includes: selectively treating one or more surfaces of the TlBr-based detector to replace Br therein with one or more alternate halogen components while also substantially avoiding replacing some or all of the Br in other surfaces of the TlBr-based detector with the one or more alternate halogen components.

According to yet another general embodiment a method of selectively treating one or more surfaces of a thallium bromide (TlBr)-based detector to improve operational longevity thereof or restore operational capability as a room temperature detector thereto includes: detecting either a failure of the TlBr-based detector or degradation of one or more surfaces of the TlBr-based detector, the failure or degradation comprising formation of a complete or partial conductive pathway between electrodes coupled to the TlBr-based detector; and selectively treating at least portions of the one or more surfaces of the TlBr-based detector exhibiting either the failure or the degradation.

In still more general embodiments, a thallium bromide (TlBr)-based detector, includes: a bulk portion comprising TlBr, the bulk portion having one or more sidewalls, a top surface, and a bottom surface. At least the sidewalls of the bulk portion include substantially no alternate halogen component(s) to a predetermined depth.

Figure 1B:
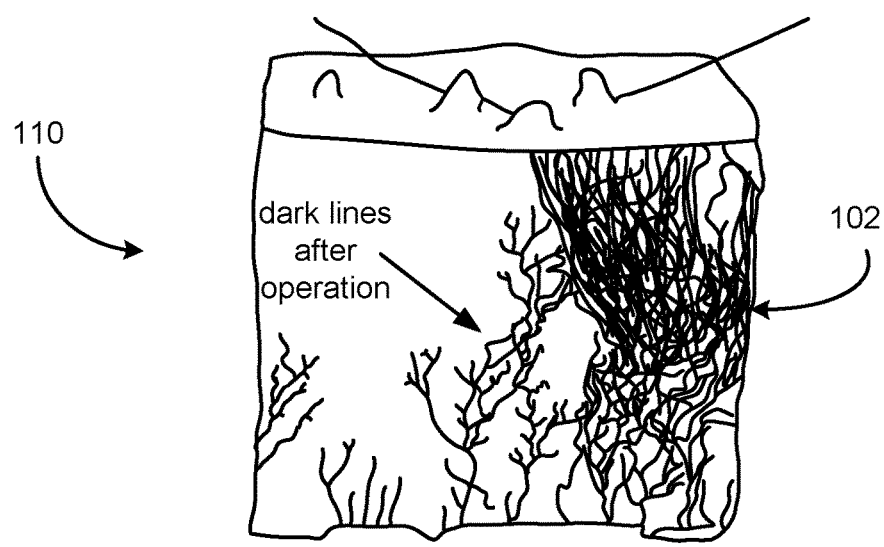
FIG. 1B is an image of a conventional TlBr-based detector with surfaces where some or all of the Br has been replaced with an alternate halogen and dendritic Tl pathways formed thereon during operation of the detector in a nitrogen atmosphere.

Turning now to the figures, FIGS. 1A-1B are photographs of a conventional TlBr-based detector 100, 110 exhibiting dendritic, conductive pathways 102 of thallium metal following application of a bias in an atmosphere of air, and an atmosphere of nitrogen, respectively. The pathways 102 formed as a result of exposed surfaces of the detector reacting with the surrounding environment and application of the bias to the detector 100, 110. Each detector 100, 110 was subjected to the same conditions, with the exception of the surrounding environment being air for detector 100 and nitrogen (N$_2$) for detector 110. Comparing the detectors 100, 110, it can be seen that operation in a nitrogen environment exacerbates the degradation thereof (formation of conductive pathways 102).

To address the foregoing problems associated with conventional detector structures having exposed surfaces where some or all of the Br has been replaced with an alternate halogen e.g. F, Cl, or I, the presently disclosed inventive detectors generally exclude substantially all halogen component(s) (i.e. halogens other than the bromine of the TlBr bulk material) from one or more surfaces thereof exposed to the surrounding environment. Preferably, particularly for TlBr-based detectors, the excluded halogen component(s) are selected from chlorine, fluorine, and iodine. Those having ordinary skill in the art will appreciate that in other embodiments where the detector is formed of a material including a primary halogen component other than Br, the eligible species of alternate halogen component may include Br, while excluding another species of halogen, e.g. F, Cl, or I (whichever is the primary halogen component for the detector composition).

In one embodiment, a TlBr-based detector includes a bulk portion comprising TlBr. The bulk portion is defined by one or more sidewalls, a top surface, and a bottom surface. At least the sidewalls of the bulk portion comprise substantially no alternate halogen component(s) to a predetermined depth.

Figure 3:
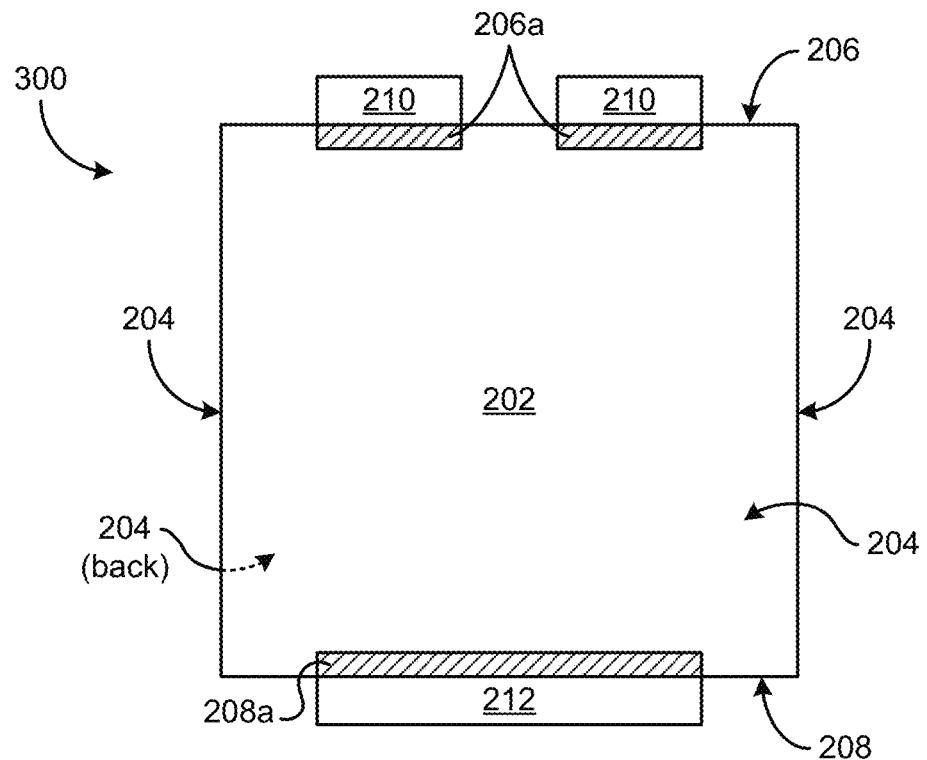
FIG. 3 is a simplified schematic of a TlBr-based detector having surfaces thereof selectively treated to remove the surface layer where some or all of the Br has been replaced with an alternate halogen according to another embodiment of the presently disclosed inventive concepts.

In more embodiments, either or both of the top surface and the bottom surface may include substantially no alternate halogen (e.g. F, Cl, and/or I) components in region(s) thereof exposed to a surrounding environment. In other words, the regions of the top and/or bottom surfaces that are not coupled to or formed under electrodes which are in turn formed on or coupled to the top or bottom surface are the regions which include substantially no alternate halogen component(s). Graphically, such embodiments are in accordance with the detector 300 as shown in FIG. 3. Preferably, both the top and bottom surfaces include substantially no alternate halogen (e.g. the F, Cl, and/or I) component(s) in the exposed regions thereof, and the alternate halogen component(s) are excluded from the surfaces to a predetermined depth, e.g. 0.1-100 μm in various embodiments.

The predetermined depth to which Tl and the alternate halogen (e.g. F, Cl, and/or I) components are removed from the treated surface(s) is preferably in a range from approximately 0.1 μm to approximately 100 μm. The depth may be tuned by adjusting treatment conditions (e.g. identity of the etchant, polishing technique, treatment time, temperature, etc.) and most preferably is configured to remove substantially all alternate halogen components and accompanying Tl that were previously incorporated into the treated surfaces to at least a depth to which those alternate halogen (e.g. F, Cl, and/or I) components were previously incorporated. As will be appreciated by persons having ordinary skill in the art upon reading the instant disclosures, alternate halogen penetration depth is a function of the identity of the alternate halogen species (or compound including the halogen species) and the methodology used to incorporate alternate halogen into the surfaces of the detector.

In various embodiments, alternate halogen may be incorporated into a detector structure using any suitable technique known in the art. In preferred approaches, a conventional mixed ionic-electronic conductor (e.g. TlBr)-based radiation detector with alternate halide-treated (F, Cl, or I) surfaces may be formed according to techniques previously disclosed by the inventors of the presently described subject matter, e.g. as represented in U.S. Pat. No. 9,000,384 to Conway, et al. and entitled "Mixed Ionic-Electronic Conductor-Based Radiation Detectors and Methods of Fabrication," the contents of which are herein incorporated by reference.

In the context of the presently disclosed inventive embodiments, such conventional mixed ionic-electronic conductor-based radiation detectors may subsequently or concurrently be treated to improve operational longevity thereof, e.g. using techniques such as described herein with reference to FIGS. 6-8 and methods 600, 700 and/or 800, in various embodiments.

Returning to detector structures in accordance with the presently disclosed inventive concepts, in one embodiment the treated surfaces, e.g. the sidewalls, of the detector are characterized by a surface roughness of approximately 1 μm RMS. As described in further detail below, and shown graphically in FIGS. 4B and 5B, selective treatment of detector surfaces as disclosed herein advantageously improves the smoothness of the treated surfaces, further improving the operational longevity of the detector.

FIGS. 2-5B are described in greater detail below with reference to methods 600, 700, and 800.

Figure 5A:
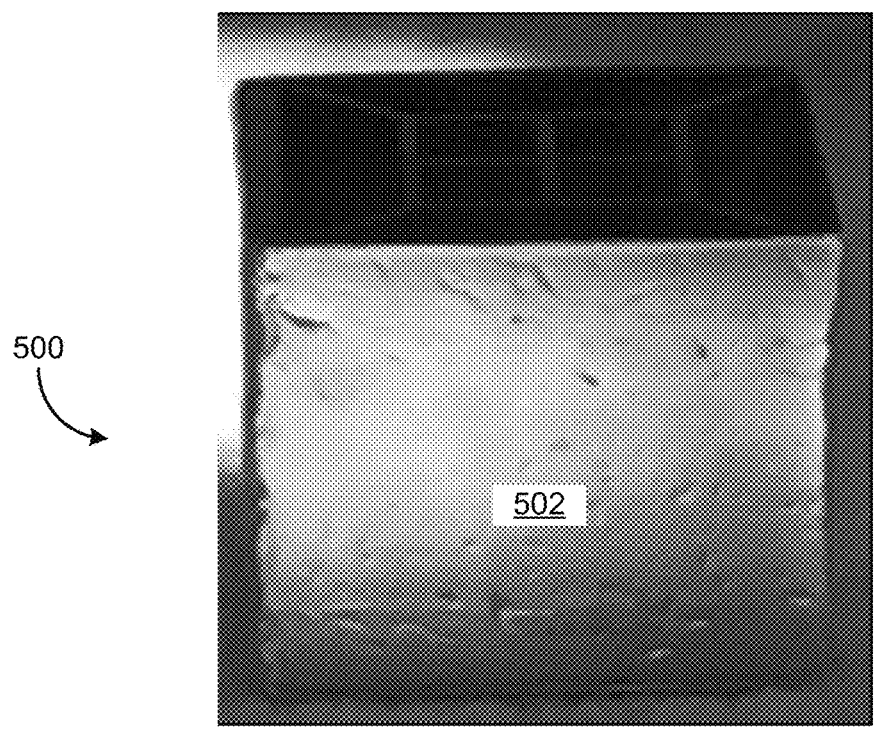
FIG. 5A is a photographic image of a TlBr-based detector with surfaces thereof selectively treated to remove the surface layer where some or all of the Br has been replaced with Cl, according to one embodiment of the presently disclosed inventive concepts.
Figure 5B:
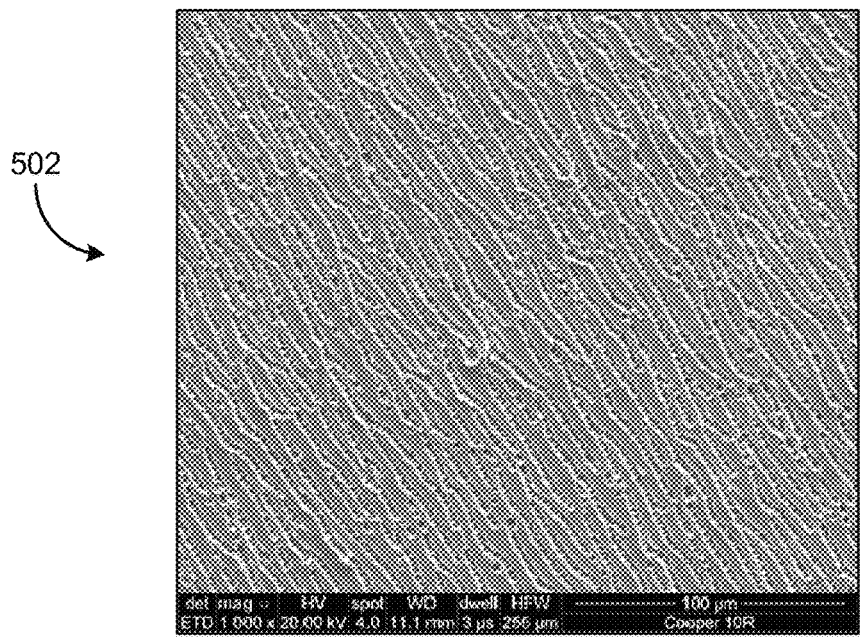
FIG. 5B is a SEM image of the treated surface of the inventive TlBr-based detector shown in FIG. 5A.
Figure 6:
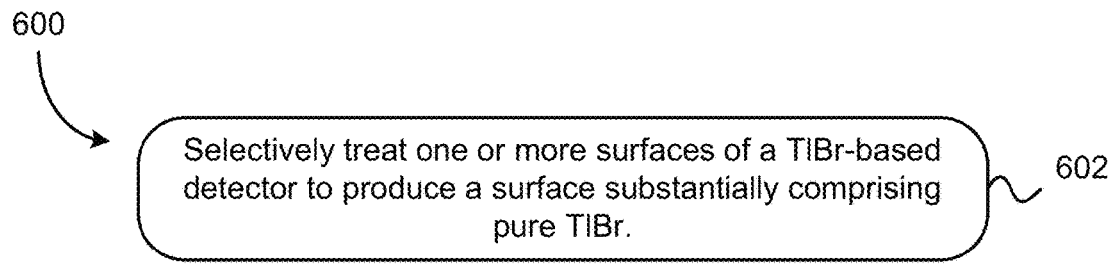
FIG. 6 is a flowchart of a method, according to one embodiment of the presently disclosed inventive concepts.

FIG. 6 shows a method 600 for improving operational longevity of a thallium bromide (TlBr)-based detector, in accordance with one embodiment. As an option, the present method 600 may be implemented to construct, treat, and/or restore detectors such as those shown in FIGS. 2-3 and 5A-5B described herein. Of course, however, the method 600 and others presented herein may be used to improve the longevity of detectors in a variety of applications which may or may not be related to the illustrative embodiments listed herein. Further, the methods presented herein may be carried out in any desired environment. Moreover, more or less operations than those shown in FIG. 6 may be included in method 600, according to various embodiments. It should also be noted that any of the aforementioned features may be used in any of the embodiments described in accordance with the various methods.

According to the embodiment of FIG. 6, method 600 includes operation 602, in which one or more surfaces of a TlBr-based detector are selectively treated to substantially remove all of the TlBr that incorporates an alternate halogen. Selectively removing this alternate halogen and incorporated Tl effectively restores the surface composition to pristine, or "substantially pure" TlBr, and improves the smoothness of the treated surface(s). Each of these effects contributes to prevention or resistance against formation of conductive pathways such as shown in FIGS. 1A-1B, and thus improves the operational longevity of the detector. In preferred approaches, the improvement is on the order of ten-fold longer operational longevity than a conventional detector having alternate halogen component(s) incorporated into the surface(s) thereof (again, as shown in FIGS. 1A-1B).

As referred to herein, "substantially removing" TlBr that incorporates alternate halogen component(s) from surfaces produces a surface having an alternate halogen concentration of approximately 1 at % or less of the alternate halogen component(s) to at least predetermined depth. The depth to which the TlBr incorporating alternate halogen component(s) is/are removed may be tailored based on the treatment conditions, as discussed in greater detail below. Correspondingly, a surface having "substantially no" alternate halogen component(s) included/incorporated therein exhibits an alternate halogen concentration of approximately 1 at % or less in a region from the surface to the predetermined depth. Conversely, a surface "substantially comprising pure [material]" consists of at least 99 at % of the material, e.g. substantially pure TlBr refers to a surface or bulk that is at least 99 at % TlBr, and potentially includes up to 1 at % of other components, such as alternate halogen components.

Additionally, it should be noted that removal of TlBr incorporating alternate halogen component(s) refers to the removal of TlBr incorporating alternate halogen component(s) that is/are not part of the TlBr semiconductor, i.e. alternate halogen component(s) that were added to the TlBr semiconductor using known methods. Accordingly, in preferred embodiments TlBr incorporating alternate halogen component(s) removed via selective treatment as described herein are selected from chlorine, iodine, and fluorine, and exclude bromine. For semiconductor compositions other than TlBr-based detectors, the alternate halogen component(s) subject to removal may include bromine, and/or may exclude one or more of the chlorine, iodine, and/or fluorine.

Figure 2:
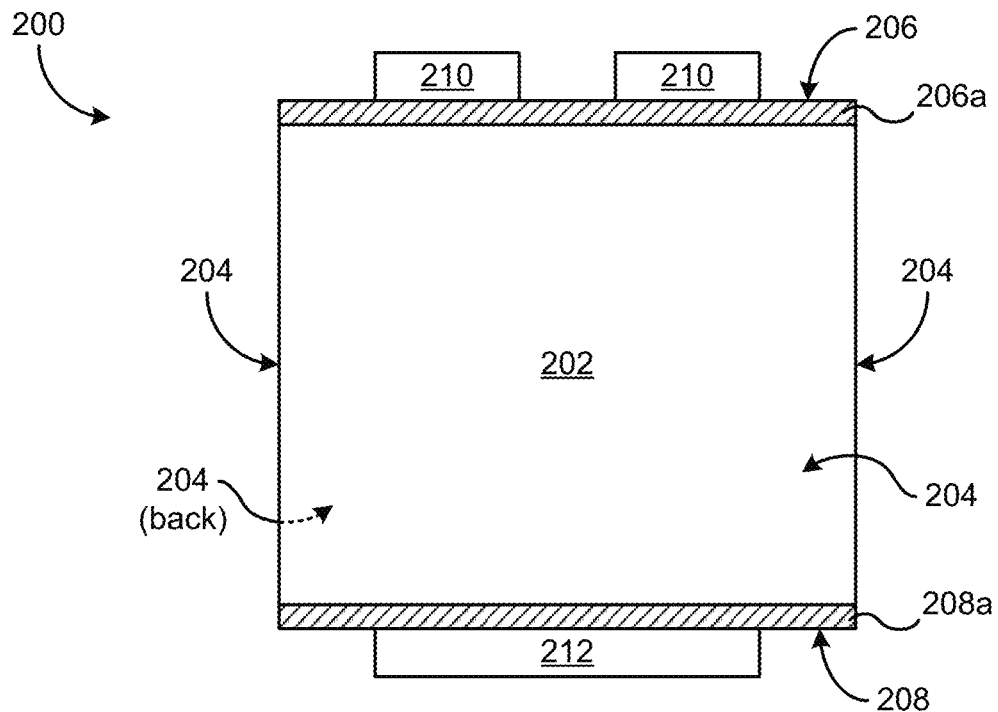
FIG. 2 is a simplified schematic of a TlBr-based detector having surfaces thereof selectively treated to remove the surface layer where some or all of the Br has been replaced with an alternate halogen according to one embodiment of the presently disclosed inventive concepts.

In preferred embodiments of method 600, the one or more surfaces that are selectively treated comprise at least sidewalls of the TlBr-based detector, e.g. sidewalls 204 as shown in FIGS. 2-3 and described in greater detail below.

Experimentally, the inventors have observed that formation of the conductive pathways in the detector occurs on surfaces thereof which are exposed to the surrounding atmosphere (e.g. air, nitrogen, etc. depending on operating environment and/or the type of radiation targeted for detection). More specifically, the conductive pathways form primarily on sidewalls of the detector in response to an applied bias, initiating at or near surfaces (or portions thereof) adjacent to the cathode, and traveling toward the anode until a conductive path is completed, subsequently shorting the detector. Accordingly, it is particularly preferable to ensure the sidewalls of the detector structure are treated so as to substantially remove TlBr incorporating alternate halogen component(s) therefrom. One exemplary embodiment of a detector 200 having sidewalls 204 selectively treated to substantially remove TlBr incorporating alternate halogen component(s) therefrom to a predetermined depth is shown in FIG. 2.

The detector 200 according to the embodiment of FIG. 2 includes a bulk portion 202 comprising, or preferably consisting of, a suitable semiconductor material capable of detecting radiation of a particular type, such as gamma radiation, at room temperature. Preferably, the bulk portion comprises or consists of TlBr, or a TlBr based semiconductor. Bulk portion 202 is defined by sidewalls or side surfaces 204 as well as top and bottom surfaces 206, 208. According to the embodiment of FIG. 2, the detector 200 is configured as a substantially cubic shape, but other shapes may be employed (e.g. a polygonal or cylindrical monolith, a sphere or elliptical monolith, a thin film, etc.) without departing from the scope of the presently disclosed inventive concepts.

With continuing reference to FIG. 2, the top and bottom surfaces 206, 208 have formed thereon, or coupled thereto, electrodes 210, 212, respectively. As shown in FIG. 2, the top and bottom surfaces 206, 208 are characterized by incorporation of alternate halogen component(s) such as chlorine, fluorine, and/or iodine. In various embodiments, the detector 200 as shown in FIG. 2 may be formed via halogenation of all surfaces of the bulk portion 202, followed by selective treatment to substantially remove TlBr incorporating alternate halogen component(s) from the sidewalls 204. Alternatively, and as described below with reference to FIG. 7, a structure such as shown in FIG. 2 may be accomplished via selective alternate halogenation of only the top and/or bottom surfaces 206, 208 of the detector 200.

Regardless of the particular methodology employed to form the structure, embodiments in accordance with FIG. 2 are characterized by top and bottom surfaces 206, 208 including/incorporating one or more alternate halogen components to a predetermined depth in a range from approximately 0.1 µm to approximately 100 µm, forming alternate halogen-containing regions 206a near the top surface 206 and 208a near the bottom surface 208. The alternate halogen component(s) incorporated in regions 206a and/or 208a are preferably independently selected from chlorine, fluorine, and iodine, and preferably exclude bromine (particularly where the bulk portion 202 comprises or consists of a TlBr-based semiconductor material).

In more embodiments, a detector 300 such as shown in FIG. 3 may be formed via selective treatment of one or more surfaces of the detector 300 to substantially remove TlBr incorporating alternate halogen component(s) therefrom, and/or via selective alternate halogenation of portions of one or more of the surfaces. The detector 300 is characterized by substantially the same structure and composition as described above with reference to FIG. 2, but is further characterized by the top and bottom surfaces 206, 208 having been selectively treated and/or selectively halogenated, in addition to the sidewalls 204.

As a result, the alternate halogen-containing regions 206a and 208a are characterized by being positioned directly adjacent to (or under) the respective electrode 210, 212 formed on or coupled to the corresponding surface 206, 208. Accordingly, embodiments in accordance with the detector structure shown in FIG. 3 are characterized by the sidewalls 204, as well as exposed portions of the top and bottom surfaces 206, 208 having substantially no alternate halogen component(s) included/incorporated therein.

Embodiments consistent with the structure shown in FIG. 3 are particularly well suited for detectors comprising a coplanar grid of electrodes operating at different potentials. Since the electrodes within the coplanar grid operate at different potentials, the surface(s) of the detector between the electrodes are prone to forming dendritic conductive pathways in a similar manner as described above with reference to FIGS. 1A-1B and 2 concerning formation of such pathways between the cathode and anode. Accordingly, selectively removing TlBr incorporating alternate halogen component(s) from the exposed portions of the detector surface(s) between the electrodes avoids such degradation and improves longevity of the corresponding detector. Similarly, selectively alternate halogenating only the regions of the detector surface which will be positioned under the electrode(s) conveys improved operational longevity of the detector.

Without wishing to be bound to any particular theory, the inventors propose that the applied bias causes the thallium and bromine to separate, generating thallium metal deposits at or near grain boundaries of the detector surface (to a predetermined depth in which halogen components are incorporated). This may be caused by greater availability and/or mobility of bromine vacancies at grain boundaries, allowing the bromine to escape, e.g. as $Br_2$ gas, and leaving behind thallium deposits along the grain boundaries. This theory explains the dendritic structure of the conductive pathways formed in/on the detector surfaces, and is supported by experimental evidence.

In one experiment, two detectors were halogenated by treatment with hydrochloric acid. The first detector was treated for a period of three hours, in a hydrochloric acid solution incubated at a temperature of approximately 50° C. (Hot-HCl) to produce a surface layer with more Cl. The second detector was treated for a period of three hours, in an identical hydrochloric acid solution, but incubated at a temperature of approximately 20° C. (RT-HCl) to produce a surface layer with less Cl than that treated at 50° C. Both detectors were subjected to the same applied bias, and both exhibited formation of dendritic thallium deposits initiating at the cathode and progressing toward the anode.

However, the detector treated with hot-HCl exhibited much more rapid dendrite formation than the detector treated with RT-HCl. Inspection of the surfaces of the two detectors revealed that the hot-HCl treated detector exhibits a much more uniform surface morphology, but also included more grain boundaries than the less uniform morphology exhibited by the RT-HCl treated detector. The inventors theorize this uniform morphology and greater availability of grain boundaries explains the tendency of the hot-HCl treated detector to degrade (form dendritic thallium deposits) more rapidly than the RT-HCl treated detector.

In more embodiments of method 600, the one or more surfaces that are selectively treated may also include portions of at least a top surface of the detector, the portions of the top surface being exposed rather than coupled to or located under an electrode coupled to or formed on the top surface. Optionally, portions of the bottom surface that are exposed rather than coupled to or formed under the electrode coupled to or formed on the bottom surface of the detector may be selectively treated to remove TlBr incorporating alternate halogen therefrom.

In some embodiments of method 600, selectively treating the one or more surfaces of the TlBr-based detector may include: applying a mask or a protective coating to other surfaces of the TlBr-based detector; and etching the TlBr-based detector in an etchant solution without etching the other surfaces of the TlBr-based detector.

In various embodiments, the mask or protective coating may comprise any suitable material understood by skilled artisans as resistant to chemical reaction with the etching solution. In some approaches, the mask/coating material may comprise a material commonly used to store the corresponding solution. Generally, the mask/coating may be or comprise a polymer, glass, a metal, and/or a photoresist, according to several embodiments.

Further still, in some approaches selectively treating the one or more surfaces of the TlBr-based detector may include etching the one or more surfaces with a solution comprising an etchant selected from: water, bromine methanol, a peroxide, ammonium hydroxide, and potassium hydroxide.

Preferably, the etching is performed under suitable conditions (e.g. etching in room temperature water for 12 to 24 hours, or etching in room temperature bromine methanol for 5 to 10 seconds, etc. as would be understood by a person having ordinary skill in the art upon reading the present descriptions) to a depth in a range from approximately 0.1 µm to approximately 100 µm, e.g. 1, 10, 15, 25, 50, 100 µm in various approaches. More preferably, the etching is performed so as to remove substantially all TlBr incorporating alternate halogen from the detector surfaces to the appropriate depth. In particularly preferred embodiments, after treatment the surfaces of the TlBr-based detector exhibit an alternate halogen concentration of approximately 1 at % or less, most preferably excluding alternate halogen entirely to the corresponding depth.

Surfaces that are selectively treated may preferably exhibit an average surface roughness of approximately 1 µm RMS or less following treatment thereof. Without wishing to be bound to any particular theory, the inventors postulate that the improved smoothness of the TlBr-based detector surfaces following treatment further improves the longevity of the detector. In some embodiments, smoothing of the surface may be sufficient to improve detector longevity, but preferably both improved smoothness and exclusion/removal of halogen component(s) from the exposed surface(s) of the detector are implemented.

According to preferred embodiments of method 600, treated surfaces generally substantially comprise pure TlBr with substantially no alternate halogen component(s) incorporated therein, while the other (untreated) surfaces substantially comprise TlBr and may optionally incorporate alternate halogen component(s) therein.

Figure 4A:
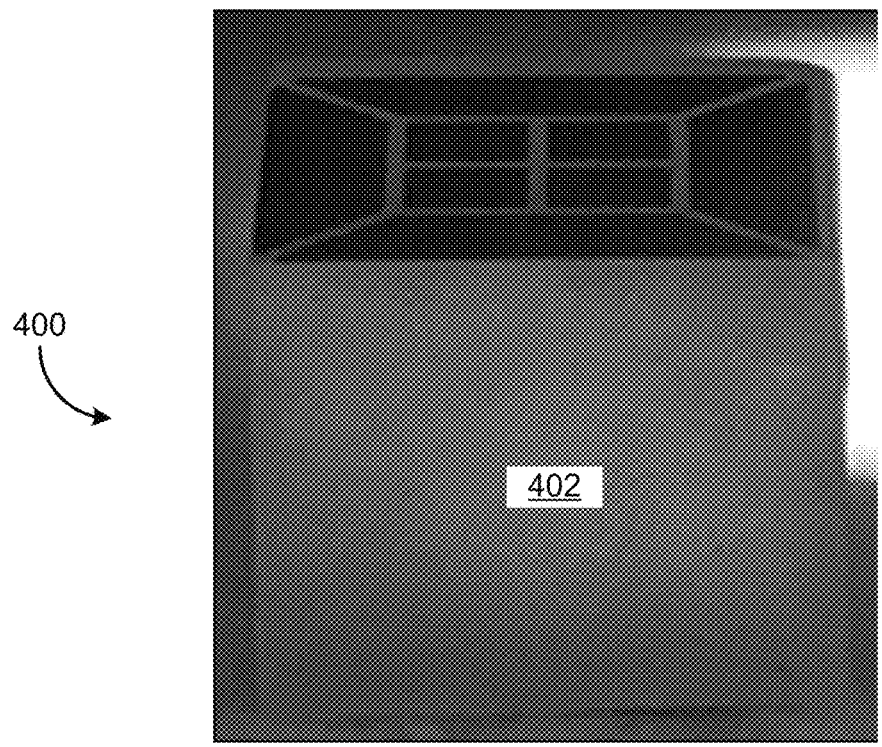
FIG. 4A is a photographic image of a conventional TlBr-based detector with surfaces incorporating chlorine following treatment with HCl.
Figure 4B:
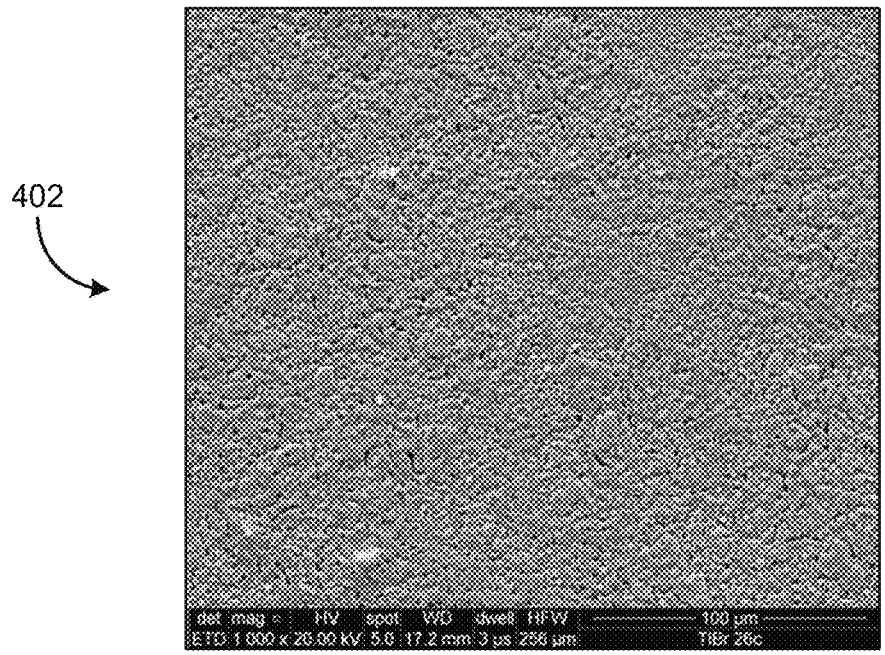
FIG. 4B is a SEM image of the chlorinated surface of the conventional TlBr-based detector shown in FIG. 4A.

According to one embodiment, FIGS. 4A-4B and 5A-5B visually demonstrate the differences between detector surface characteristics for detectors having alternate halogenated surfaces (FIGS. 4A-4B) and detectors having substantially no alternate halogen component(s) following selective treatment thereof. More particularly, the detector 400 shown in FIG. 4A was treated in HCl to incorporate chlorine into surfaces 402 thereof, while the detector 500 shown in FIG. 5B was etched with water to substantially remove TlBr incorporating alternate halogen component(s) from the surface 502 thereof. FIGS. 4B and 5B show the disparate surface morphology of the respective surfaces 402, 502, and particularly the relatively smooth structure of the water-etched surface 502 of detector 500.

The improved smoothness of the detector surfaces was not an expected outcome of the treatment process, and since the improved smoothness apparently contributes to extended detector longevity, embodiments of the presently disclosed inventive concepts in which surfaces of the detector are etched (e.g. as opposed to surfaces having portions thereof coupled to or formed under an electrode being selectively halogenated without halogenating exposed portions of the surface(s)) are particularly preferred.

Of course, in additional and/or alternative embodiments detectors formed via selective alternate halogenation of the detector surface(s) may be further improved via additional processing to improve smoothness of the selectively alternate halogenated and/or non-halogenated portions of the surfaces. Such additional processing may include any suitable technique known in the art and which a skilled artisan would appreciate, upon reading these descriptions, as being capable of achieving an average surface roughness of approximately 1 µm RMS or less. For instance, surfaces may be polished, annealed, plasma-etched, etc. according to various approaches without departing from the scope of the presently disclosed inventive concepts.

Moreover, any of the foregoing operations or features set forth with respect to method 600 and FIG. 6 may be combined in any suitable manner, and/or may be employed in combination with operations and/or features as set forth with respect to methods 700 and/or 800 without departing from the scope of the present descriptions.

Figure 7:
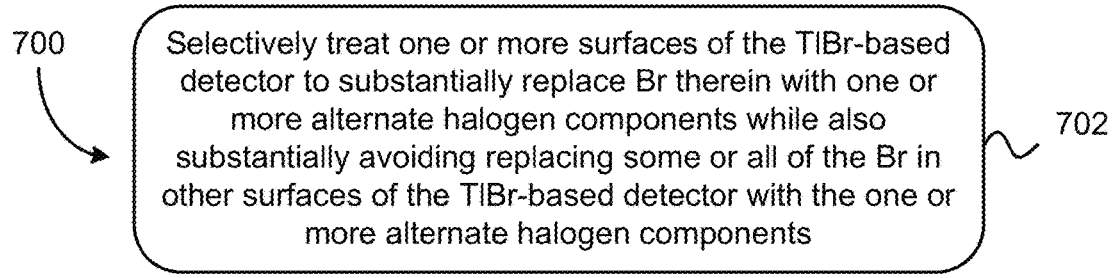
FIG. 7 is a flowchart of a method, according to one embodiment of the presently disclosed inventive concepts.

FIG. 7 shows a method 700 for forming a thallium bromide (TlBr)-based detector exhibiting improved operational longevity, in accordance with one embodiment. As an option, the present method 700 may be implemented to construct detectors such as those shown in FIGS. 2-3 and 5A-5B. Of course, however, the method 700 and others presented herein may be used to improve the longevity of detectors in a variety of applications which may or may not be related to the illustrative embodiments listed herein. Further, the methods presented herein may be carried out in any desired environment. Moreover, more or less operations than those shown in FIG. 7 may be included in method 700, according to various embodiments. It should also be noted that any of the aforementioned features may be used in any of the embodiments described in accordance with the various methods.

In accordance with FIG. 7, method 700 includes operation 702, in which one or more surfaces of the TlBr-based detector are selectively treated (e.g. selectively halogenated with one or more alternate halogen components) to substantially replace Br therein with one or more alternate halogen components while also substantially avoiding replacing Br with the one or more alternate halogen components in other surfaces of the TlBr-based detector.

As referred to herein, "substantially avoiding" inclusion/incorporation of alternate halogen component(s) in detector surface(s) produces surface(s) having an alternate halogen concentration of approximately 1 at % or less of the alternate halogen component(s) to at least predetermined depth. The depth to which the alternate halogen component(s) is/are removed may be tailored based on the treatment conditions, as discussed elsewhere herein. Correspondingly, a surface having "substantially no" alternate halogen component(s) included/incorporated therein exhibits a halogen concentration of approximately 1 at % or less in a region from the surface to the predetermined depth.

Conversely, a surface "substantially comprising" a "pure" composition should be understood as exhibiting at least 99 at % of the named composition, i.e. including 1 at % or less of material other than the named composition. For example, a material or surface "substantially comprising pure TlBr" corresponds to a material or surface that is at least 99 at % TlBr, and includes 1 at % or less of other components such as alternate halogen components. According to preferred embodiments of method 700, treated surfaces generally substantially comprise TlBr with alternate halogen component(s) incorporated therein, while the other (untreated) surfaces substantially comprise pure TlBr. Where treatment includes polishing without etching to selectively halogenate surfaces, the polished surfaces may or may not include alternate halogen component(s) following treatment.

Additionally, it should be noted that avoiding inclusion/incorporation of alternate halogen component(s) refers to the incorporation of alternate halogen component(s) that is/are not part of the TlBr semiconductor, i.e. alternate halogen component(s) added to the TlBr semiconductor after formation thereof. Accordingly, in preferred embodiments the alternate halogen component(s) for which inclusion/incorporation thereof is avoided via selective halogenation are selected from chlorine, iodine, and fluorine, and exclude bromine. For semiconductor compositions other than TlBr-based detectors, the halogen component(s) for which inclusion/incorporation thereof is avoided may include bromine, and/or may exclude one or more of the chlorine, iodine, and/or fluorine.

In some embodiments of method 700, selectively treating the one or more surfaces of the TlBr-based detector may include: applying a mask or a protective coating to the other surfaces of the TlBr-based detector; and etching the masked or protected TlBr-based detector in a solution comprising one or more halogen components.

In various embodiments, the mask or protective coating may comprise any suitable material understood by skilled artisans as resistant to chemical reaction with the solution including the halogen component(s). In some approaches, the mask/coating material may comprise a material commonly used to store the corresponding solution including the halogen component. Generally, the mask/coating may be or comprise a polymer, glass, a metal, and/or a photoresist, according to several embodiments.

For instance, in several embodiments the material may comprise a glass or a polymer, particularly in the case of solutions such as HCl, HI, etc.; while in other embodiments the mask/coating material may exclude glass, particularly for HF solutions. Of course, other suitable mask/coating materials that would be appreciated by a person having ordinary skill in the art upon reading the present descriptions may be employed without departing from the scope of the inventive concepts disclosed herein.

In accordance with at least one embodiment of method 700, the other surfaces (i.e. surfaces that are not selectively treated) include at least the sidewalls of the TlBr-based detector. As the conductive pathways tend to form in the exposed, treated regions of the detector, and the sidewalls form the vast majority of such regions, avoiding treatment within the sidewalls provides the greatest improvement to operational longevity of the detector. In more embodiments, the other surfaces may include portions of at least a top surface of the TlBr-based detector, the portions of the top surface being exposed rather than coupled to or located under an electrode coupled to or formed on the top surface. Optionally, corresponding exposed portions of the bottom surface of the detector may be avoided during selective treatment, and thus preferably exclude substantially all alternate halogen component(s) to a predetermined depth.

Additionally or alternatively, to provide the additional longevity improvements associated with smooth surfaces of the detector, method 700 may include polishing the other surfaces of the TlBr-based detector to an average surface roughness of approximately 1 μm RMS or less. Polishing may be performed in addition to, or instead of, etching in various embodiments.

Of course, any of the foregoing operations or features set forth with respect to method 700 and FIG. 7 may be combined in any suitable manner, and/or may be employed in combination with operations and/or features as set forth with respect to methods 600 and/or 800 without departing from the scope of the present descriptions.

Figure 8:
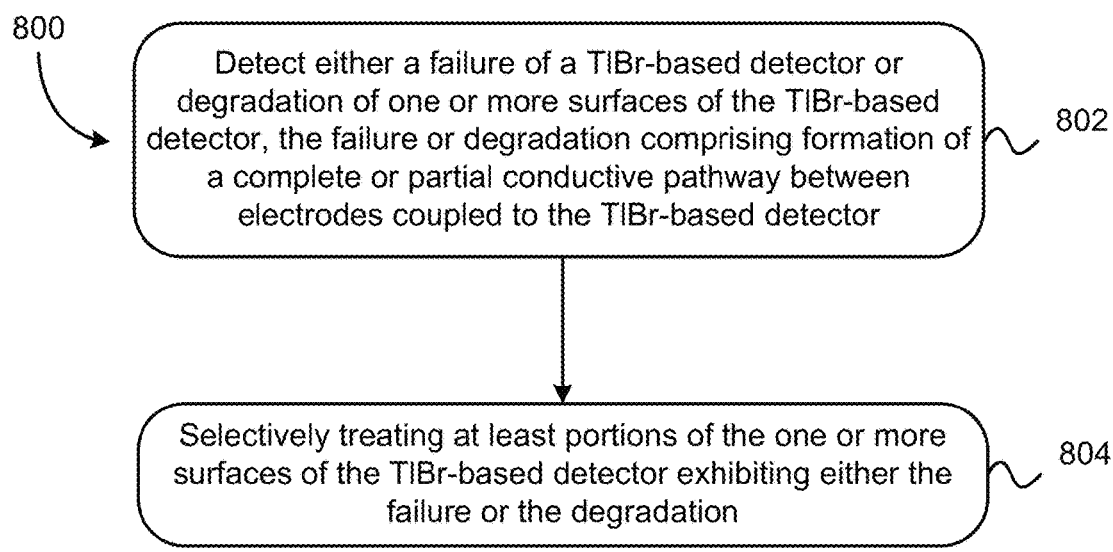
FIG. 8 is a flowchart of a method, according to one embodiment of the presently disclosed inventive concepts.

FIG. 8 shows a method 800 for selectively treating one or more surfaces of a thallium bromide (TlBr)-based detector to improve the operative longevity thereof or restore operational capability as a room temperature spectrometer thereto, in accordance with one embodiment. As an option, the present method 800 may be implemented to treat and/or restore detectors such as those shown in FIGS. 1-5B. Of course, however, the method 800 and others presented herein may be used to restore functionality to, and/or improve the longevity of detectors in a variety of applications which may or may not be related to the illustrative embodiments listed herein. Further, the methods presented herein may be carried out in any desired environment. Moreover, more or less operations than those shown in FIG. 8 may be included in method 800, according to various embodiments. It should also be noted that any of the aforementioned features may be used in any of the embodiments described in accordance with the various methods.

As shown in FIG. 8, method 800 includes at least two operations 802, 804. Operation 802 involves detecting either a failure of the TlBr-based detector or degradation of one or more surfaces of the TlBr-based detector. The failure or degradation is a result of formation of a complete or partial conductive pathway between electrodes coupled to the TlBr-based detector, e.g. as shown and described with reference to FIGS. 1A-1B.

In operation 804, the longevity of the detector is improved, and/or the functionality of the detector is restored (in event of failure), by selectively treating at least portions of the surfaces of the TlBr-based detector exhibiting either the failure or the degradation. The selective treatment may be performed substantially as discussed above regarding method 600, but those having ordinary skill in the art will appreciate that the inventive embodiments represented by method 800 convey the additional concept that the presently disclosed inventive techniques enable repetitive, substantial extension of detector longevity via treatment to remove alternate halogen and/or conductive pathways from surfaces of the detectors via etching, polishing, etc. as would be understood by a person having ordinary skill in the art upon reading the present descriptions.

Since the TlBr bulk portion of the detector structure is soft and soluble in many etchants including those described herein, the etching process not only removes halogen components from the treated surfaces, but may optionally dissolve the surface layer to a predetermined depth, thereby removing the conductive pathway from the detector. Polishing may accomplish similar results, according to preferred approaches.

Accordingly, in one embodiment of method 800, selectively treating portions of the TlBr-based detector includes etching the at least portions of the surfaces of the TlBr-based detector with a solution comprising an etchant selected from: water, bromine methanol, a peroxide, ammonium hydroxide, and potassium hydroxide. Treatment conditions may vary according to the identity of the etchant, as will be appreciated by skilled artisans upon reviewing the instant descriptions.

In preferred embodiments of method 800, the one or more surfaces that are selectively treated include at least the sidewalls of the TlBr-based detector. However, according to additional embodiments the one or more surfaces that are selectively treated may also include portions of at least a top surface of the detector. The portions of the top surface that are treated are preferably those portions that are exposed rather than coupled to or located under an electrode coupled to or formed on the top surface. Optionally, corresponding portions of the bottom surface of the detector may similarly be subjected to selective treatment to remove halogen and/or conductive pathways therefrom.

The surfaces that are selectively treated preferably exhibit a surface roughness of approximately 1 µm RMS or less following treatment, in preferred embodiments.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A method of improving operational longevity of a thallium bromide (TlBr)-based detector, the method comprising:
    selectively treating one or more surfaces of the TlBr-based detector to produce a surface substantially comprising pure TlBr; and
    wherein prior to selective treatment the one or more surfaces of the TlBr-based detector are compositionally characterized by some or all of the Br having been replaced with one or more alternate halogen components.

2. The method as recited in claim 1, wherein the one or more surfaces that are selectively treated comprise at least sidewalls of the TlBr-based detector.

3. The method as recited in claim 1, wherein the one or more surfaces that are selectively treated comprise portions of at least a top surface of the detector, the portions of the top surface being exposed rather than coupled to or located under an electrode coupled to or formed on the top surface.

4. The method as recited in claim 1, wherein selectively treating the one or more surfaces of the TlBr-based detector comprises etching the one or more surfaces with a solution comprising an etchant selected from: water, bromine methanol, a peroxide, ammonium hydroxide, and potassium hydroxide.

5. The method as recited in claim 1, wherein selectively treating the one or more surfaces of the TlBr-based detector comprises:
    applying a mask or a protective coating to other surfaces of the TlBr-based detector; and
    etching the one or more surfaces of the TlBr-based detector in an etching solution without etching the other surfaces of the TlBr-based detector.

6. The method as recited in claim 1, wherein selectively treating the one or more surfaces smoothes the one or more surfaces to an average surface roughness of approximately 1 µm RMS or less.

7. The method as recited in claim 1, wherein selectively treating the one or more surfaces removes TlBr and alternate halogen component(s) incorporated therewith to a predetermined depth; and
    wherein the predetermined depth is in a range from approximately 0.1 µm to approximately 100 µm.

8. A method of forming a thallium bromide (TlBr)-based detector exhibiting improved operational longevity, the method comprising:
    selectively treating one or more surfaces of the TlBr-based detector to replace Br therein with one or more alternate halogen components while also substantially avoiding replacing some or all of the Br in other surfaces of the TlBr-based detector with the one or more alternate halogen components; and
    wherein the one or more surfaces substantially comprise pure TlBr following the selective treatment thereof; and
    wherein the one or more surfaces comprise at least sidewalls of the TlBr based detector.

9. The method as recited in claim 8, wherein selectively treating the one or more surfaces of the TlBr-based detector comprises:
    applying a mask or a protective coating to the other surfaces of the TlBr-based detector; and
    etching the masked or protected TlBr-based detector in a solution comprising one or more of the alternate halogen components.

10. The method as recited in claim 8, wherein the other surfaces substantially comprise pure TlBr following the selective treatment of the one or more surfaces of the TlBr-based detector; and wherein the other surfaces comprise portions of at least a top surface of the TlBr-based detector, the portions of the top surface being exposed rather than coupled to or located under an electrode coupled to or formed on the top surface.

11. The method as recited in claim 8, comprising: polishing the other surfaces of the TlBr-based detector to an average surface roughness of approximately 1 μm RMS or less; and wherein the other surfaces substantially comprise pure TlBr following the selective treatment of the one or more surfaces of the TlBr-based detector.

12. A method of selectively treating one or more surfaces of a thallium bromide (TlBr)-based detector to improve operational longevity thereof or restore operational capability as a room temperature detector thereto, the method comprising:

detecting either a failure of the TlBr-based detector or degradation of one or more surfaces of the TlBr-based detector, the failure or degradation comprising formation of a complete or partial conductive pathway between electrodes coupled to the TlBr-based detector; and selectively treating at least portions of the one or more surfaces of the TlBr-based detector exhibiting either the failure or the degradation, wherein selectively treating the at least portions of the one or more surfaces of the TlBr-based detector comprises etching the at least portions of the one or more surfaces of the TlBr-based detector with a solution comprising an etchant selected from: water, bromine methanol, a peroxide, ammonium hydroxide, and potassium hydroxide; and wherein the at least portions that are etched substantially comprise pure TlBr following the selective treatment.

13. The method as recited in claim 12, wherein selectively treating the at least portions of the one or more surfaces of the TlBr-based detector comprises polishing the at least portions of the one or more surfaces of the TlBr-based detector; and wherein the at least portions that are polished substantially comprise pure TlBr following the selective treatment.

14. The method as recited in claim 12, wherein the at least portions that are selectively treated comprise at least sidewalls of the TlBr-based detector; and wherein the at least portions that are selectively treated substantially comprise pure TlBr following the selective treatment.

15. The method as recited in claim 12, wherein the at least portions that are selectively treated comprise portions of at least a top surface of the TlBr-based detector, the portions of the top surface being exposed rather than coupled to or located under an electrode coupled to or formed on the top surface; and wherein the at least portions that are selectively treated substantially comprise pure TlBr following the selective treatment.

16. The method as recited in claim 12, wherein selectively treating the one or more surfaces smoothes the one or more surfaces to an average surface roughness of approximately 1 μm RMS or less.

17. A thallium bromide (TlBr)-based detector, comprising:

a bulk portion comprising TlBr, the bulk portion having one or more sidewalls, a top surface, and a bottom surface; and wherein at least the sidewalls of the bulk portion comprise substantially no alternate halogen component(s) to a predetermined depth in a range from approximately 0.1 μm to approximately 100 μm from the sidewalls of the bulk portion;

wherein first portions of the top surface of the bulk portion comprise one or more alternate halogen components to a predetermined depth in a range from approximately 0.1 μm to approximately 100 μm from the top surface of the bulk portion;

wherein other portions of the top surface of the bulk portion comprise substantially no alternate halogen components to a predetermined depth in a range from approximately 0.1 μm to approximately 100 μm from the top surface of the bulk portion; and wherein the first portions of the top surface correspond to positions on the top surface of the detector to which one or more electrodes are configured to couple.

18. The detector as recited in claim 17, wherein the other portions of the top surface are region(s) thereof exposed to a surrounding environment.

19. The detector as recited in claim 17, wherein first portions of the bottom surface of the bulk portion comprise one or more alternate halogen components to a predetermined depth in a range from approximately 0.1 μm to approximately 100 μm from the bottom surface of the bulk portion;

wherein other portions of the bottom surface of the bulk portion comprise substantially no alternate halogen components to a predetermined depth in a range from approximately 0.1 μm to approximately 100 μm from the bottom surface of the bulk portion; and wherein the first portions of the bottom surface correspond to positions on the bottom surface of the detector to which one or more electrodes are configured to couple.

20. The detector as recited in claim 17, wherein the other portions of the bottom surface are region(s) thereof exposed to a surrounding environment.

21. The detector as recited in claim 17, wherein the alternate halogen component(s) are selected from chlorine, fluorine, and iodine.

* * * * *